US010866323B2

(12) United States Patent
Kallankari et al.

(10) Patent No.: US 10,866,323 B2
(45) Date of Patent: Dec. 15, 2020

(54) TESTING METHOD AND ARRANGEMENT FOR GPS POSITIONING MEASUREMENTS

(71) Applicant: Verkotan Oy, Oulu (FI)

(72) Inventors: Jani Kallankari, Oulu (FI); Pekka Jokitalo, Oulu (FI); Kari Komonen, Oulu (FI); Pertti Mäkikyrö, Oulu (FI)

(73) Assignee: Verkotan Oy, Oulu (FI)

( * ) Notice: Subject to any disclaimer, the term of this patent is extended or adjusted under 35 U.S.C. 154(b) by 451 days.

(21) Appl. No.: 15/434,692

(22) Filed: Feb. 16, 2017

(65) Prior Publication Data

US 2017/0242129 A1 Aug. 24, 2017

(30) Foreign Application Priority Data

Feb. 18, 2016 (FI) ...................................... 20165126

(51) Int. Cl.
*G01S 19/23* (2010.01)
*G01R 29/08* (2006.01)
*G01R 29/10* (2006.01)

(52) U.S. Cl.
CPC .......... *G01S 19/23* (2013.01); *G01R 29/0821* (2013.01); *G01R 29/105* (2013.01)

(58) Field of Classification Search
CPC ... G01S 19/23; G01S 19/254; G01R 29/0821; G01R 29/105; H04B 17/00; H04B 17/17; H04B 17/18; H04B 17/21

(Continued)

(56) References Cited

U.S. PATENT DOCUMENTS 8,401,506 B2 * 3/2013 Yu .......................... H04W 24/06
324/627
8,412,112 B2 4/2013 Foegelle
(Continued)

FOREIGN PATENT DOCUMENTS

CN 202133681 U 2/2012
EP 1455193 A2 9/2004
(Continued)

OTHER PUBLICATIONS

GNSS Over-the-Air Testing using Wave Field Synthesis, Alexander Rugamer, Sep. 16-20, 2013; Proceedings of the 26th International Technical Meeting of the ION Satllite Division.*
(Continued)

*Primary Examiner* — Erin F Heard
*Assistant Examiner* — Michael W Justice
(74) *Attorney, Agent, or Firm* — Berggren LLP

(57) ABSTRACT

The present invention discloses a test method and arrangement for testing GNSS signals within a test chamber. The test chamber inner walls are supplied with transmitting antennas supplying simulated satellite signals, originating from a signal generator. Dynamic satellite movements are simulated by interpolating several transmitted signals in order to create a single true satellite transmission signal. All visible satellites are taken into account in order to create simulated GPS signals across the whole virtual sky. Phantom objects may be used near the device under test and the phantom object may be moved or rotated in preset patterns within the test chamber. Radio channel information can be modelled according to several different real-life environments, and also reflections from any surfaces and different multipath options are taken into account in the modeling, and also in the transmission antenna angles towards the device under test. Main application areas of the invention (Continued)

comprise sports watches, health related or any other monitoring devices, or any devices benefiting from the positioning information, also relating to animal applications. The device may be carried or worn by the human user or any other living creature, as a wearable positioning device.

18 Claims, 3 Drawing Sheets

(58) Field of Classification Search
USPC .............................................. 342/357.62, 195
See application file for complete search history.

(56) References Cited

U.S. PATENT DOCUMENTS

| | | | | |
|---|---|---|---|---|
| 2004/0183547 | A1* | 9/2004 | Kildal | G01R 29/0821 |
| | | | | 324/627 |
| 2004/0235541 | A1* | 11/2004 | Iwai | G01R 29/0814 |
| | | | | 455/575.7 |
| 2006/0132355 | A1* | 6/2006 | Krenz | G01R 29/0814 |
| | | | | 342/165 |
| 2013/0271317 | A1* | 10/2013 | Goel | G01S 19/23 |
| | | | | 342/357.62 |
| 2014/0225773 | A1* | 8/2014 | Boulton | G01S 19/23 |
| | | | | 342/357.62 |
| 2014/0225774 | A1 | 8/2014 | Boulton | |
| 2014/0253372 | A1* | 9/2014 | Davis | G01S 19/23 |
| | | | | 342/357.42 |
| 2015/0229417 | A1* | 8/2015 | Reed | H04B 7/0413 |
| | | | | 375/226 |

FOREIGN PATENT DOCUMENTS

| | | |
|---|---|---|
| WO | 2010094000 A2 | 8/2010 |
| WO | 2010139840 A1 | 12/2010 |

OTHER PUBLICATIONS

Effect and Correction of Unequal Cable Losses and Dispersive Delays on Delay-and-Sum Beamforming, Q. Liu, 2012 IEEE.*
Keysight Technologies, GPS Receiver Testing, Jul. 31, 2014 (Year: 2014).*
Rügamer A. et al., "GNSS Over-the-Air Testing using Wave Field Synthesis", Proceedings of the 26th International Technicall Meeting of the ION Satellite Division, ION GNSS+ 2013, Nashville, Tennessee, Sep. 16-20, pp. 1931-1943, [retrieved on Sep. 7, 2016]. Retrieved from the Internet: <http://www.iis.fraunhofer.de/content/dam/iis/en/doc/Iv/los/lokalisierung/GNSS_over_the_air_testing.pdf>.
Finnish Patent and Registration Office, Search Report issued on FI20165126, dated Sep. 15, 2016.

* cited by examiner

TESTING METHOD AND ARRANGEMENT FOR GPS POSITIONING MEASUREMENTS

PRIORITY

This application claims priority of a Finnish national application number F120165126 filed on Feb. 18, 2016 the contents of which is incorporated herein by reference.

FIELD OF THE INVENTION

The present invention relates to GNSS simulations where especially global satellite signals are modelled in a test environment.

BACKGROUND OF THE INVENTION

Radio performance testing has been long performed in relation to mobile phone networks and radio links associated with these networks. Nowadays, several applications and mobile devices use GNSS services, meaning "Global Navigation Satellite System". American GPS ("Global Positioning System") and Russian GLONASS are examples of such global satellite systems which give possibilities to various positioning related applications.

A lot of portable or movable devices currently use a positioning application, comprising map applications e.g. in a smartphone, vehicles and their navigation apparatuses, smartwatches or other wrist-held devices which track the user's activities e.g. in sports or health related measurement applications. A sports watch especially needs an accurate positioning data all the time because a small error in e.g. the running distance measurements through position tracking may accumulate quickly in a form of significantly false information given to the user of the sports watch.

In prior art, it is possible to measure GPS satellite signals directly from the satellites themselves. It is also possible to model the radio channel between the satellites and the device under test (DUT) in some way in relation to the fixed location of the GPS receiver.

Publication U.S. Pat. No. 8,854,260 (Boulton) discloses an OTA ("Over The Air") testing method for GNSS where multi-channel generators are used to create spatially dispersed signals. Boulton uses a test chamber where plurality of zones bounded by azimuth and elevation limits are defined, and where satellites are simulated by transmitting antennas placed in the zones of a hemi-spherical chamber. A single antenna may locate in each zone, or e.g. two antennas in a single zone to create a circularly polarized TX signal. Exemplary numbers of zones include 12-16 zones and 20-32 zones. Phantom object such as a simulated user head is also mentioned in Boulton. The system creates a satellite signal in a single zone, and when the satellite moves across the simulated sky, there is a handover-type of change from one zone to another adjoining zone. Some of the transmitting antennas may be set to simulate multipath reflections of the LOS (Line-of-sight) satellite signals. The device under test is located in the middle of the chamber, and its orientation may be modified.

Publication U.S. Pat. No. 9,116,232 (Goel) discloses an apparatus for testing satellite navigation system receiver performance, as well. Goel includes the rotating possibility of the DUT around three rotation axes as shown in FIG. 4. The satellites and their movements are simulates through a ring-shaped arrangement as shown in FIG. 5. Goel incorporates two ring-shaped orbital planes which represent the satellite constellation of two satellites during the performance test of the DUT receiver.

Publication US 2004/0235541 (Iwai) discloses a use of a human phantom apparatus used in RX measurements within a test chamber (such as anechoic room). The human phantom comprises a head section, a body section, and an arm & hand & shoulder sections for holding the measured apparatus in the hand section. The measurement arrangement discussed in Iwai is a PDA-type of holding the device in front of the phantom body, such as during internet browsing with a smartphone. The phantom can be rotated like shown in FIG. 11, which seems to place the base station antenna in an arbitrary direction in view of the user smartphone.

Publication U.S. Pat. No. 8,412,112 (Foegelle) illustrates a multipath RF environment in an anechoic chamber. The arrangement is used to create multipath simulated signals through a group of TX antennas by using a variable path simulator. This introduces a delay spread in each of the paths, allowing creation of reflections and interfering signal sources, and the device under test locates in the middle of the chamber.

The drawbacks of the known techniques include that the prior art arrangements have many restrictions in their applicability in GNSS simulations of the measured device. Furthermore, the prior art uses a handover-kind of switching between the artificial satellite signal transmissions which leads easily to discontinuities in the transmitted signals, resulting in non-conformance with the real-world situation of the GPS positioning signals. Furthermore, there are some geometrical restrictions in the prior art, emphasized by the ring-shaped positions of the transmission antennas of Goel.

DETAILED DESCRIPTION OF THE INVENTION

The present invention introduces an arrangement, a method and a corresponding computer program for testing devices based on simulated GNSS network across the sky. The arrangement comprises a test chamber. In a preferable embodiment, the test chamber is an anechoic chamber, mitigating the effects of external radio sources within the chamber and also for mitigating unwanted reflections from the inner walls of the test chamber based on the simulated transmission signals. The tested device can also be called as a device under test, i.e. DUT.

Figure 1:
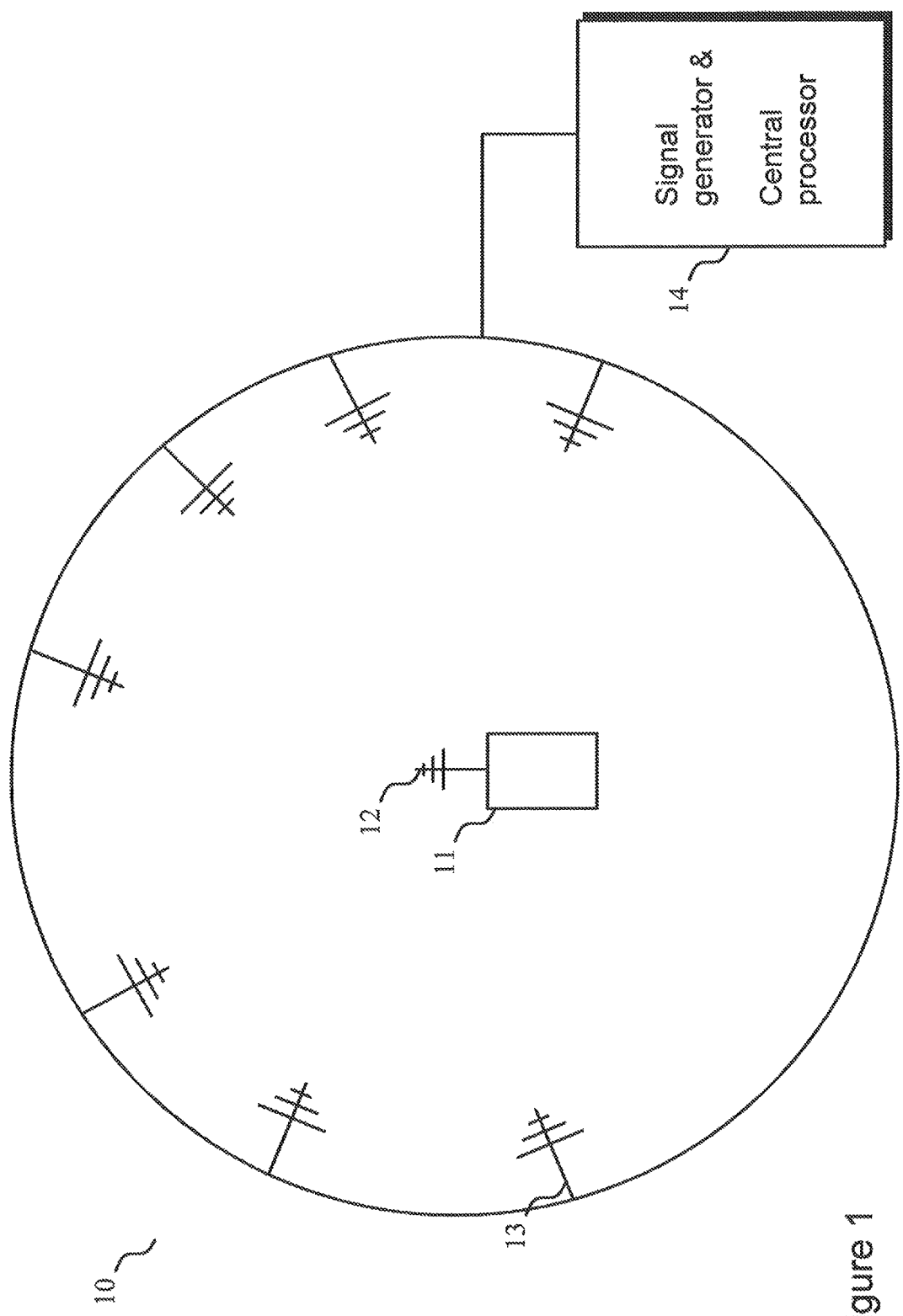
FIG. 1 illustrates an example of a round-shaped test chamber used in an embodiment of the present invention.

FIG. 1 illustrates a simplified illustration of a test environment, in a first exemplary embodiment.

A test chamber 10 is provided with a plurality of transmitting antennas 13. They may be attached on the inner walls of the test chamber 10 or fixed to an otherwise known locations within the test chamber. The source signals are created by e.g. GPS signal generators 14. There may be a plurality of signal generators which are controlled by a central processor 14. These signal generators are used to create the GNSS (such as e.g. GPS) transmitting signals across the whole sky in the tested location, as a dynamic model. The satellites move across the real sky all the time, and therefore the number of visible satellites and their azimuths and elevations in a given location on ground will change all the time also in this virtual sky represented by the test chamber 10. The dynamic model of the satellite TX signals is thus controlled centrally in the control unit 14.

The test chamber 10 comprises a plurality of transmitting antennas 13. The simulated TX signals of the transmitting antennas 13 locating e.g. as fixed on the inner walls of the test chamber 10 need to emulate as well as possible the real TX signals of the visible satellites. If the satellite model representing the satellite locations of the true sky at a certain time instant comprises a satellite which does not locate exactly at the position of one of the TX antennas 13 on the virtual sky, there is a need to apply several TX antennas to create the same RF signal effect as a single real satellite does. In such a case, the single satellite TX signal is created by using multiple TX antennas 13 within the test chamber, and interpolating the generated and transmitted signals through these antennas. For instance, usually a single satellite signal can be created artificially by 3 . . . 5 closest transmitting antennas on the virtual sky relating to the spot of the true satellite.

Figure 2:
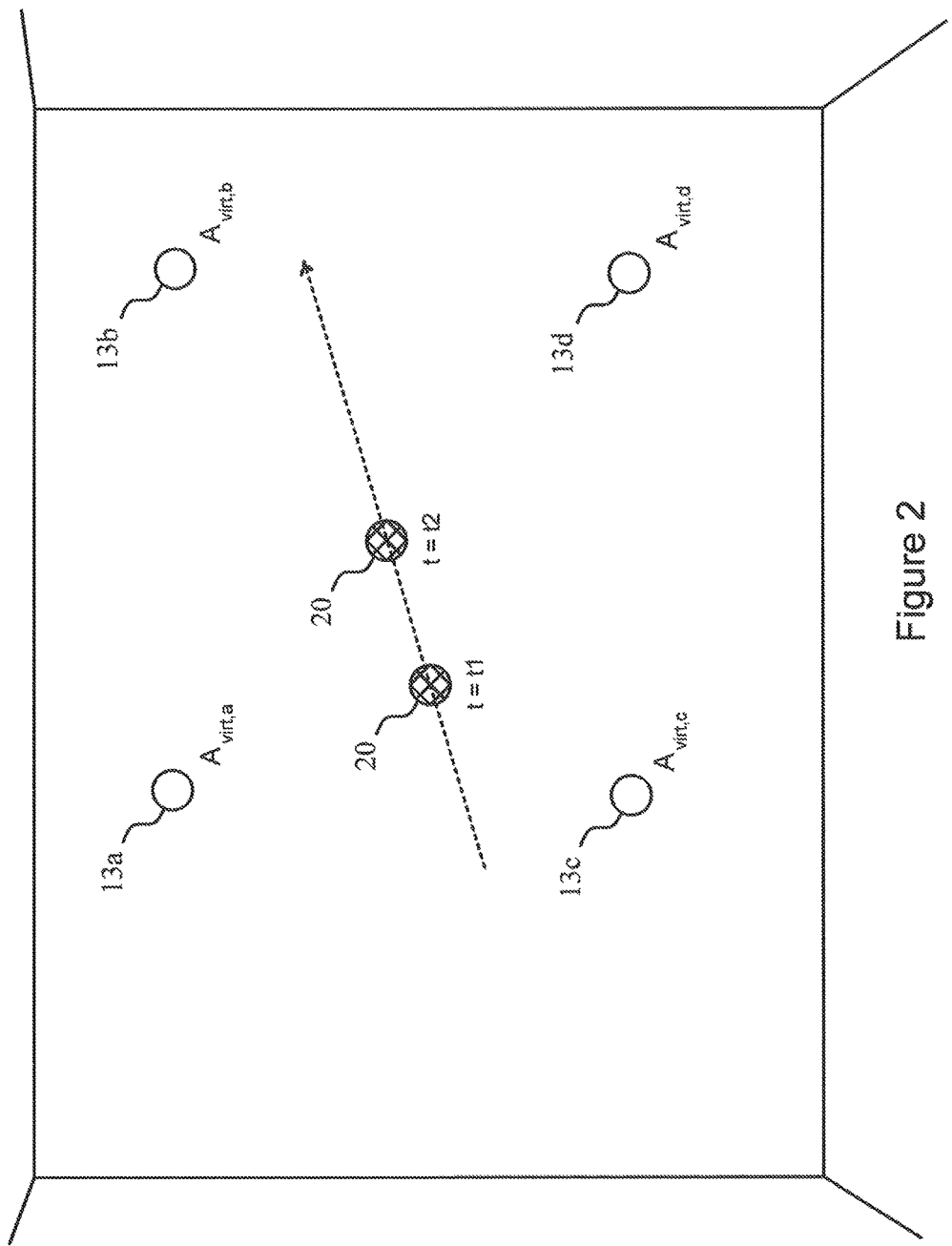
FIG. 2 illustrates an exemplary orbit of a satellite within the virtual sky.

An example of the geometry is shown in FIG. 2. The geometry is illustrated in 2-dimensions like a test chamber wall of a rectangular room depicted from the inside. The view in this example comprises four transmitting antennas 13a-13d fixed to the inner wall of the test chamber. The task in the FIG. 2 is to recreate a satellite locating in the sky in location 20 in view of the device under test. The question is to find the same RF signal level and other properties (such as polarization) in the DUT receiver whether there is a true single satellite GPS signal from the direction 20 in the sky, or several artificial satellite transmitters in a bit different locations 13a-d representing the virtual sky. If the true satellite signal transmits an RF signal $A_{sat}$, we can define the artificial satellite transmitters 13a, 13b, 13c and 13d to each have a transmitted RF signal $A_{virt,a}$, $A_{virt,b}$, $A_{virt,c}$, $A_{virt,d}$. All these signals are complex signals which each comprises an amplitude and a phase. The true satellite orbit along the sky for a single satellite is shown as a dashed line in FIG. 2, illustrating two separate time instants $t_1$ and $t_2$ as snapshots taken along the orbit. In the exemplary situation and locations of FIG. 2, the transmitted signals from each of the antennas 13a-d of the test chamber 10 can be defined as follows in time instant $t_1$:

$$A_{virt,a}(t_1)=0.35*A_{sat} \quad (1)$$

$$A_{virt,b}(t_1)=0.4*A_{sat} \quad (2)$$

$$A_{virt,c}(t_1)=0.1*A_{sat} \quad (3)$$

$$A_{virt,d}(t_1)=0.15*A_{sat} \quad (4)$$

Furthermore, the satellite constellation changes in time, and in time instant $t_2$, the inspected satellite 20 has moved to the position shown on the right along the dashed line. In that moment $t_2$, the transmitted signals from each of the antennas 13a-d of the test chamber 10 can be defined as follows in time instant $t_2$:

$$A_{virt,a}(t_2)=0.25*A_{sat} \quad (5)$$

$$A_{virt,b}(t_2)=0.25*A_{sat} \quad (6)$$

$$A_{virt,c}(t_2)=0.25*A_{sat} \quad (7)$$

$$A_{virt,d}(t_2)=0.25*A_{sat} \quad (8)$$

When these transmitted complex signals are summed together, the sum must naturally fulfil the following condition for all values of t:

$$\sum_{i=a}^{d} A_{virt,i}(t) = A_{sat} \quad (9)$$

In other words, the signals of the plurality of transmission antennas 13a-d are interpolated so that the DUT sees the summed transmissions. These summed transmissions will form the same signal as a single true GPS antenna would. This calculation logic is multiplied into the dynamic system of all visible satellites across the sky. After this scaling process, the DUT will eventually see the same RF signal as it would from the set of true GPS satellites.

As a special situation relating to the above, when the modelled true satellite locates exactly on the spot of a single test chamber antenna (this a fully theoretical single time instant), the satellite signal can be emulated merely by the single on-spot transmitting antenna. However, it is notable that because the satellites move all the time across the sky, this is only a single time instant in the dynamic model of the satellites.

On the other hand, if the sky (virtual or not) is looked in more detail and in closer range, the true satellites of the sky never locate exactly on the spot of a transmitting antenna but there is always at least a small difference in the locations. Therefore, it can be concluded that the present invention applies interpolation of at least two transmission antennas in practice all the time.

Of course there are several satellites visible in the sky, and the group of transmitters 13a-d within the test chamber will each create the signals for the sum of all satellite transmission. Therefore, a single TX antenna, such as the transmitting antenna 13c, may contribute to several different satellites in a given time instant. All these signal components will be summed up together, when looked at the point of view of the DUT. The present invention will transform the satellite data (with the orbits and visibilities over the horizon as a function of time) into an accurate virtual sky data created by the transmitted signals by the group of antennas 13a—(the first four are visible in the Figure, but their number is not limited).

The device under test 11, 31 is placed in the test chamber 10, and in a first preferred example, such a place would be selected in the center point of the test chamber 10 volume; in other words, in the middle of the plurality of transmitting antennas 13. In one embodiment, the device under test 11, 31 is any device capable of determining its own location through GNSS based functionality, such as through a GPS locationing module, for instance. In one embodiment, the device under test is a wearable consumer product, such as a sport watch, smartwatch or any other portable device which is e.g. connectable around the user's wrist, or carriable otherwise by the user. Of course, the concept comprises also health related monitoring applications. The device may be placed on or around other parts of the human user body (such as around the ankle), or placed in a pocket of the user's clothes. Other options comprise a device integrated in or attachable to the shoe, e.g. in the shoe sole. The concept comprises thus the idea of any wearable (integrated or otherwise connected within/to the wearable) product comprising a positioning device and application, such as a GPS receiver. The receiver could be incorporated within the fabric of the user's clothes, shoes, sports equipment in use (e.g. ski, bicycle), support tool (such as a walking stick) or any other wearable item, such as a hat or a helmet. The location where the receiver locates in relation to the user body, is relevant in determining the channel model and fading characteristics based on the human body as such in view of the device and the receiver within it.

Of course, the device 11, 31 may be some other apparatus, not just designed for use by humans, but by animals and generally any form of life, or e.g. by movable robots. These kinds of applications comprise locationing bands placed with the pet dogs, for instance.

As a further example, the device 11, 31 may also be located within any kind of a living body, such as below the skin of an animal, for instance. One optional solution may be that a health related application and a corresponding device comprises a positioning module and such a module may even locate in the tissue of a human patient. For instance, a diabetes patient could be provided a small measurement module taking automatical blood samples when desired, without the need of taking them manually from the fingertip. Such a measurement module may be provided with a locationing functionality giving possibilities for additionally alarming a health specialist through data transmission means, if needed. Such applications may be called as medical GPS units applicable in human or also for veterinary use.

As already discussed above, a very useful application area is sports and exercising activities where the users of the device prefer tracking e.g. their running distances (or cycling or skiing distances) through the GPS positioning functionality. When the user runs and the GPS receiver device is placed around the user's wrist, it must be taken into account that the user's hand typically moves in a pendulum-type of motion, and of course the running environment changes all the time along the running route. Also the user may make very sharp turns, changing drastically the relative directions of the LOS satellites visible in the sky. The channel modelling algorithm should adapt to these kinds of situations as well.

The body of the human user creates a notable shadowing effect because e.g. in locations far from the equator, the group of visible satellites are concentrated in southern directions in the northern hemisphere, and similarly in northern directions in the southern hemisphere. Therefore, there can emerge a situation where a majority of the visible satellites are behind the user body when looked from the point of view of the wearable device. Such a situation in the northern latitudes like in Northern Europe would emerge when a runner with a wearable device runs to an eastern direction with the device attached on the left wrist, and thus, the southern sky where the satellites are, is often blocked during the running movement by the user body.

Figure 3:
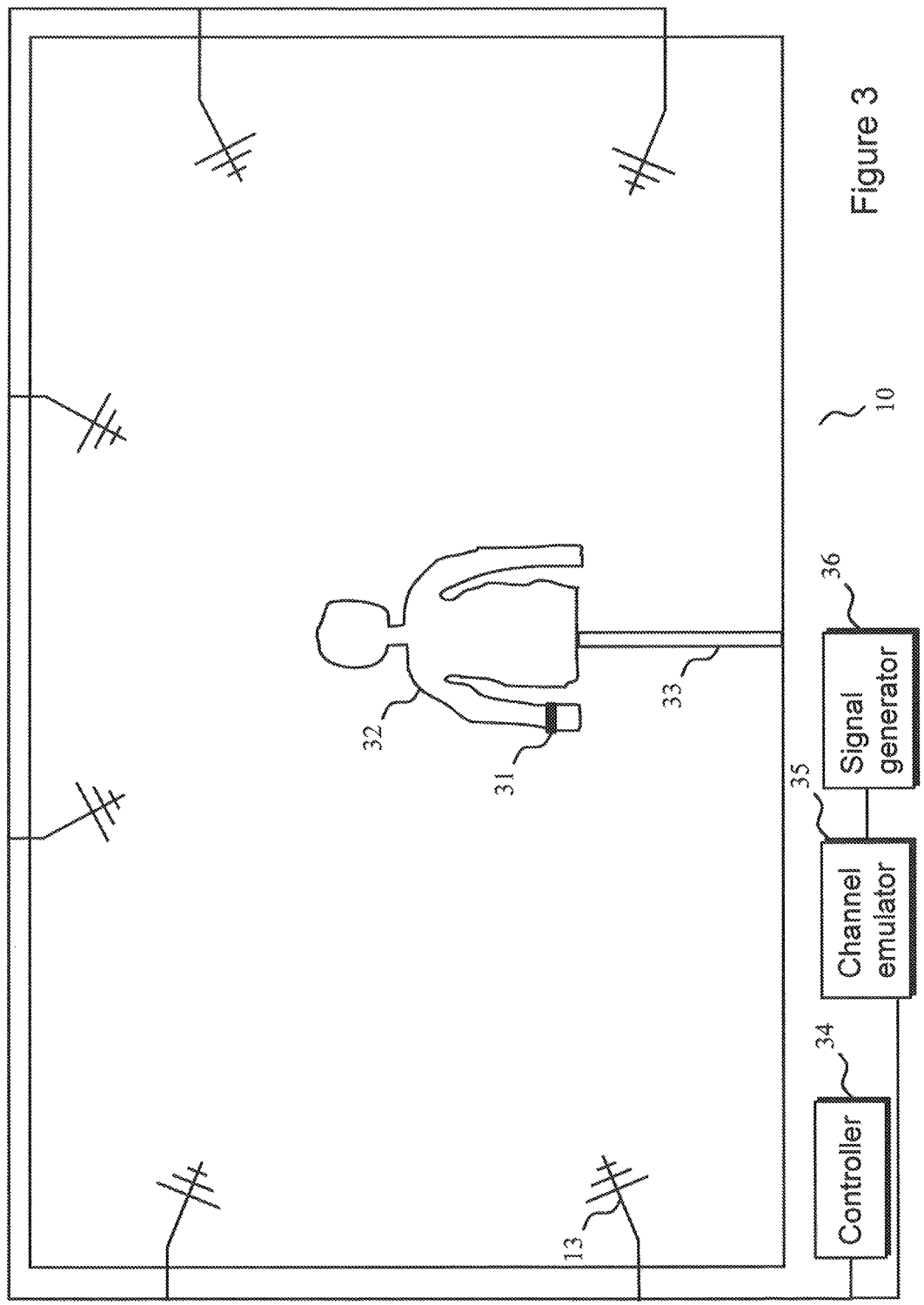
FIG. 3 illustrates an example of an anechoic rectangular test chamber comprising a human phantom object with a device under test on its wrist.

We next refer also to FIG. 3 illustrating a test measurement setup with a phantom object 32 in close vicinity or in close distance of the DUT 31. The phantom object 32 may also be in contact with the DUT 31, as is the case in the example of FIG. 3. In one optional solution, the DUT 31 may even be inside or partly inside the phantom object, such as locating just under the skin part of the phantom human object 32.

Besides the created satellite model through the TX antennas 13 within the test chamber 10, it is important to model the dynamic radio channel as correctly as possible in the test. This may be performed by a channel emulator 35 which may receive the GPS signal generator signals 36, and it adds the effect of the selected channel model. Regarding different possible environments, there are various outside environments and environments locating e.g. inside buildings near the windows. The inner structures comprise usually many walls which both mitigate and reflect any RF signals, such as received satellite signals. Sports watches are usually used in outside locations, where there might be a rural environment (e.g. denser forest path), a semi-rural environment (e.g. a village road), and an urban environment such as an urban park close to low- or even high-rise buildings. Trees create significant fading to LOS signals in many of these environments, and it would be beneficial to model these in a form or another.

An important aspect in the radio signal characteristics is that the transmitted simulated satellite signals are polarized RF signals, as are the real satellite TX signals. Polarization may comprise any kinds of different types of polarization, e.g. circular, elliptical, or as a special case, a line-formed (linear) polarization. A circularly polarized signal also incorporates directional information, such as a right hand or a left hand polarization. Usually, GPS satellite signals incorporate circular polarization, and more specifically, a right-hand circular polarization (RHCP). When such polarized signals confront an object or a surface which either fades or reflects the incoming RF signal, the polarization will change comparing to the original polarization. The amount of change will depend e.g. on the material properties where the reflection takes place. For instance, a circularly polarized original signal may change so that the resulting signal after the fading and/or reflections has an elliptical polarization. In other words, a certain direction (e.g. the vertical) may be attenuated more than the other (e.g. the horizontal) direction, leading into an elliptical or even into a tilted elliptical shape in the polarization of the affected signal. It is also common that when a RHCP signal con-fronts an object surface, the resulting reflection will be turned 180 degrees, ending up as a substantially left-hand circularly polarized signal (LHCP).

In a more general fashion, reflections from real-life surfaces or objects result in changes in polarization, delay and/or as Doppler changes as well. These effects change the channel model. The unwanted changes in the polarization form a significant problem which must be taken into account in the channel models.

In one embodiment of the used arrangement, the cable lengths from the signal generator 36 via the channel emulator 35 into the transmitting antennas 13 within the test chamber 10 are optimized to have an equal length (while FIG. 3 shows just a simplified illustration on this regard). If the lengths are different, it should be taken into account when calculating the models beforehand (the phases will change in different lengths).

In one embodiment of the invention, it can be set in the test arrangement whether the device under test 31 is fixed on a left or right arm, or correspondingly, on a left or right ankle or leg.

In one embodiment of the invention, a phantom object is a human phantom which is placed in the middle of the test chamber. Or course the phantom object may be formed by emulating some other living object such as using a phantom dog. The human phantom object may comprise a whole human body or part of it, such as an upper part of the human body, i.e. a torso. It may comprise a head, an arm or both arms, together with at least part of the human body. Some parts of the phantom object may be movable such as the arm(s) when simulating e.g. the running or walking movement. The human phantom object 32 can be moved along a determined route in the test chamber 10. Another option is to move the phantom object or part of it in an oscillated movement along certain limit locations. A practical example is that the arm section of the human phantom object 32 is placed in an angle according to a usual running position of an average runner, and then the angled arm is oscillated the same fashion besides the torso of the human phantom object 32, similarly as in an average running motion.

In one embodiment of the invention, the human phantom object 32 is filled with fluids and solid materials in order to build the human phantom object 32 as resembling a true human body as well as possible, especially regarding the water content of the living human body. It is especially desirable that the human phantom object 32 emulates the dielectric properties of a true human body as well as possible. Such dielectric properties comprise conductivity and permittivity of a living human body.

Of course, the human phantom object 32 may be replaced with any other appropriate phantom object, like a phantom dog, for instance.

The phantom object 32 affects the visibility of the simulated satellites significantly in view of the device under test 31 if the DUT 31 is e.g. worn around the wrist or worn within a wearable jacket.

Also, the effect of the actions made by the device user, the person him-/herself exercising e.g. sports, is significant to the radio channel because the body of the human is usually very close to the device 31 itself. This is also called as a human body shadowing effect for the positioning device. This phenomenon could be taken into account by designing suitable RX antenna beam forms directing their antenna beams outwards from the user of the device in the normal usage situation. If a person is using a smartwatch, the display and the main part of the device will point usually outwards from the torso of the human user, but the pendulum-type of the user hand movement must be taken into account in some way.

In one embodiment of the present invention, the effect of the phantom object 32 is created by simulating the effect of the user of the device 31 programmably in the system without placing a physical phantom object in the test chamber 10. In this way, the radio channel properties with all the multipath components and the effect of the device user (e.g. sports watch user or a dog) in contact or in close distance to the DUT 31 will all be created through a simulated arrangement. The channel emulator 35 and the signal generators (14, 36) may combine the effects of the environment models and the user's body in the modelled radio channel. Of course, a selected part of the user's body may just be taken into account in the simulated radio channel determination. Simulated radio channel model will naturally be a dynamic model (depending on time) because the user or a user body part moves, and additionally, the satellites move all the time as well along the sky. The movements of the user's body in relation to the outside environment, and also the movements of the body parts in relation to the body itself (such as the oscillating movement of an angled arm) may all be taken into account in this simulated arrangement without a physical phantom object present in the test chamber 10. Furthermore, there could be modelled an average human user, or specific different types of human users in the simulated phantom object calculations. Different types may cover different heights or different body mass indexes (BMI) among the whole human population. Furthermore, the simulated user body calculations may be broadened to cover also any other form of life, such as animals.

This simulation step without presenting a physical phantom object may be implemented in the calculation means of the system; e.g. in the computer controlling the system.

In an embodiment of the present invention, the above aspects are all or partly incorporated in the channel emulator 35 which creates a dynamic model of the radio channel used in the testing scenario (whether there is a physical phantom object present or not in the test chamber). The test device operator may select some parameters, such as selecting the environment between urban, rural or semi-rural environment model, for instance. In other words, and referring to the above sections discussing possible real-life environments, there can be modelled at least one environment of the real world, comprising at least one of an urban environment model, a suburban environment model, a country-side environment model, a park area environment model and an interior environment model. A selected environment may be used in a single test, or a single test may incorporate switching among at least two different environments consecutively. The environment modelling may be performed by environment modelling means, or by the calculation means, like any processor within or available to the system. The system may select the environment model according to a preset scheme, or the user of the test arrangement may manually select the environment model.

In another embodiment of the system, the signal generators may comprise the functionality of the channel emulator. In that case it can be said that there is an integrated signal source block which also takes care of radio channel modelling or radio channel selection, and also multipath components of the signals. All signal and radio channel creation activities may be performed within the signal generators before the actual testing process in the test chamber is started. This is a cost-effective solution.

In one embodiment of the invention, the radio channel model and the dynamic satellite model is at first taken into use based on the location of the actual tests, and after that, the placements of the transmitting antennas within the test chamber are calculated and optimized for the used satellite constellation, before the actual testing is started. The angle of the transmission antenna in view of the DUT is a relevant parameter, and thereafter the distance between the transmission antenna and the DUT may be fine-tuned or set during the signal source calculations through phasing of the transmitted signals. For instance, in latitudes corresponding to the ones in Northern Europe, usually the transmitting antenna angles near and around 45 degrees above the horizon in view of the DUT form a direction where many locations of the visible satellites and their orbits can be created in the method of the invention. The reflections e.g. from the ground may be implemented by placing some of the transmitting antennas in the angle of approximately −45 degrees in view of the DUT (45 degrees below the horizon). Of course, these angular values are merely examples, and a good transmission antenna coverage along the whole virtual sky is achieved when there are transmission antennas placed in substantially uniform fashion across the virtual sky. It is however noted that the directions very close to horizontal direction from the DUT are not that relevant in creating the simulated satellite signals.

In one embodiment of the invention, all the transmitted simulated satellite signals from the plurality of antennas 13 and their reflections due to the multipath nature of the radio environment are created in a single zone or a single virtual sky which is created in the test chamber 10. In other words, the incoming directions of the transmitted signals and their multipath components in the test chamber in view of the DUT 31 form a full hemisphere where the complete sphere comprises all the volume above the horizon and also possible reflections from different directions, including the ones from below (pointing at least partly upwards). Of course, the practical real-life situation comprises usually several reflections and fadings from plurality of objects where the reflections may change directions several times until it reaches the receiver of the DUT 31.

Therefore, the TX antennas 13 within the test chamber 10 can also be placed below the height of the DUT 31, pointing upwards with a tilted angle. Preferable, the TX antennas 13 are placed with uniform mutual distances between each other, ensuring an easily manageable environment for the signals to be created. The placements of the antennas 13 need not to form any ring-shapes across the virtual sky. In one option, the mutual distance between adjacent antennas may be selected as a fixed distance value which can be applied as much as possible, concerning the geometrical restrictions of the actual test chamber 10.

The modelling of the dynamic routes of the available satellites needs to be built or set available in the signal generators 36. The user or tester may set the test environment model via a user interface in at least some of the used devices. It is also possible to switch between two different environment models in order to model changes in the modelled test environment. For the running action and when using the sports watch as a test device 31 in the user's wrist, the situation may unfold so that at first, the runner runs in a forest path in the city park, and the next minute the runner is on the street of a city next to a high building. The positioning accuracy may well deteriorate when the radio environment changes quickly, and this performance may be modelled and tested with the test arrangement according to the invention.

Or course, there could be available a number of different preset test environment models which are wanted to be used as a dynamic model of the radio channel. The selection pattern within these preset environment models may be set separately, e.g. by selecting all the preset radio channels in a looping manner, one at a time.

One option of testing may comprise a typical mobile phone or smartphone usage situation where the device under test 31 is placed in front of the human phantom, and held in the hand of the phantom, like the common situation of a user looking at the display of the device 31. Other places of the DUT in relation to the phantom object may comprise the DUT locating on the lap of the human phantom object, or near the ear of the human phantom object. The latest situation would resemble pretty much with the testing scenario of a regular cellular phone or smartphone during a phone call.

The test chamber 10 may be provided with an inner furnishing made of suitable RF fading material such that the test chamber as such is basically anechoic.

In other words summarizing all the above details, the invention discloses a method and a corresponding system for simulating a Global Navigation Satellite System (GNSS) dynamically across a virtual sky. The method is characterized in that the method comprises the steps of providing a test chamber 10 comprising a plurality of transmitting antennas 13, distributed in a free formation across a virtual sky, comprising directions above and below a horizon; placing a device under test 11, 31 in the test chamber 10; creating a dynamic satellite signal model comprising movement paths of the plurality of satellites in the sky for a given receiver location, comprising of all multipath components of the satellite signals; driving the plurality of transmitting antennas 13 individually in order to create simulated Global Navigation Satellite System signals according to the dynamic satellite signal model, where a single satellite transmission signal is modelled through creating the simulated Global Navigation Satellite System signal with at least two transmitting antennas 13 and interpolating these signals; calculating a position from the received signal of the device under test 11, 31; and determining a position error by comparing the calculated position to a reference position information. The third characterizing step can be obtained through a dynamic satellite signal model creation means of the system. Two last steps may be performed by calculation means of the system.

The GNSS system may be GPS, or any other available satellite system in the world.

Any step of the presented method is applied by a corresponding means in the system, if necessary.

In an embodiment of the invention, the plurality of the transmitting antennas 13 are fixed to an inner wall of the test chamber 10, and the device under test 11, 31 is placed substantially in the center of the test chamber 10.

In an embodiment of the invention, the test chamber 10 comprises a phantom object 32 placed in close distance or in contact with the device under test 11, 31.

In an embodiment of the invention, the phantom object 32 is a human phantom object comprising a head, a body and an at least one arm section, or comprising a part of a human body.

In an embodiment of the invention, the arm section of the human phantom object 32 is moved in relation to the body section similarly as in a walking or a running motion of a real human user.

In an embodiment of the invention, the method further comprises the step of simulating movements of the real user wearing or holding or carrying the device under test 11, 31 by moving and/or rotating and/or oscillating a part or the whole of the phantom object 32. This may be achieved by a moving and/or rotating and/or oscillating means in the system.

In an embodiment of the invention, the phantom object 32 emulates any selected form of life.

In an embodiment of the invention, a signal generator 14, 36 drives the plurality of the transmission antennas 13, the signal generator further comprising or connected to a channel emulator 35.

In an embodiment of the invention, cable lengths from the signal generator 14, 36 via the channel emulator 35 into the transmitting antennas 13 within the test chamber 10 are optimized to have an equal length, or taking the differences in the cable lengths into account in calculating the signals to be transmitted. The calculation means may take care of the latter of these options in the corresponding system.

In an embodiment of the invention, the method further comprises the steps of creating a desired dynamic satellite signal model and a radio channel model with multipath components, resulting in a group of signals to be generated; calculating locations of the plurality of transmission antennas 13 in the test chamber 10, with which the signals to be generated are most optimally achieved; and placing the plurality of the transmission antennas 13 into the calculated locations before commencing the actual tests. Two first steps may be performed by the calculation means in the system. The last step may be performed manually or by some automated location setup arrangement for the antennas within the test chamber.

In an embodiment of the invention, the method further comprises the step of modelling at least one environment of the real world, comprising at least one of an urban environment model, a suburban environment model, a country-side environment model, a park area environment model and an interior environment model; and selecting an environment model among the plurality of environment models for the test. The first step may be performed by environment modelling means. The latter step may be performed by the calculation means in the system.

In an embodiment of the invention, the method further comprises the step of modelling a dynamic radio channel based on the shadowing and/or reflecting effects of the objects present in the selected environment model, and the effect of the phantom object 32. This is obtained by the calculation means of the system.

In an embodiment of the invention, the effect of the phantom object 32 is created by simulating the effect of the user of the device under test 11, 31 programmably in the system without placing a physical phantom object in the test chamber 10. This may be performed by the calculation means; e.g. the software in the computer controlling the system.

The appropriately selected method steps may be implemented to be achieved through executing a computer program or several computer programs in a processor or other controlling means.

By the calculation means, a central processor is meant which is capable of performing all required calculations e.g. with a help of computer programs, memories or data interfaces from external systems, if necessary. In practice, the calculation means may be a computer or a server connected with the test arrangement. The computer may be located close to the signal generators near the test chamber, or the computer calculations may be performed externally, and fed separately into the signal generators and the possible channel emulators. Of course, all physical elements requiring electrical controlling may be integrated or connected together, and a specific central computer may handle all the controlling actions of the system.

In view of the above, the method according to the invention may be executed by a computer program which is run in a processor. The computer program may be stored in an appropriate medium such as in a CD-ROM or in disc drives available to the processor of a computer. Especially the model creation, signal generation, channel emulation, the phantom movement, the calculation and determination steps, and also the measurement functionalities within the DUT, discussed in the above, can be implemented through at least one computer program, and appropriate controlling means such as at least one processor.

The present invention is not restricted merely to the presented embodiments above, but it may vary within the scope of the following claims.

The invention claimed is:

1. A method for dynamically simulating a Global Navigation Satellite System across a virtual sky, wherein the method comprises the steps of:
    providing a test chamber comprising a plurality of transmitting antennas, distributed in a free formation across a virtual sky, comprising directions above and below a horizon with respect to the test chamber;
    placing a device under test in the test chamber, wherein the test chamber comprises a phantom object placed in close distance or in contact with the device under test;
    simulating movements of a real user wearing or holding or carrying the device under test by moving and/or rotating and/or oscillating a part or the whole of the phantom object during the measurement, wherein the phantom object resembles a real human shape comprising at least an upper half of a human body, comprising a body section and at least one arm section, wherein the phantom object has an effect in a measured radio channel, and wherein the arm section of the human phantom object is moved in relation to the body section similarly as in a walking or a running motion of a real human user;
    creating a dynamic satellite signal model simulating movement of a plurality of satellites in sky for a given receiver location and the model comprising all multipath components of satellite signals;
    driving the plurality of transmitting antennas individually in order to create simulated Global Navigation Satellite System signals according to the dynamic satellite signal model, wherein a single satellite transmission signal is modelled through creating the simulated Global Navigation Satellite System signal with at least two transmitting antennas and interpolating these signals;
    calculating a position from the received signals of the device under test; and
    determining a position error by comparing the calculated position to a reference position.

2. The method according to claim 1, wherein the plurality of transmitting antennas are fixed to an inner wall of the test chamber, and the device under test is placed substantially in center of the test chamber.

3. The method according to claim 1, wherein the phantom object is a human phantom object comprising a head, a body and at least one arm section, or comprising a part of a human body.

4. The method according to claim 1, wherein a signal generator drives the plurality of transmitting antennas, the signal generator further comprising or connected to a channel emulator.

5. The method according to claim 4, wherein cable lengths from the signal generator via the channel emulator into the plurality of transmitting antennas within the test chamber are optimized to have an equal length, or taking the differences in the cable lengths into account in calculating the signals to be transmitted.

6. The method according to claim 1, wherein the method further comprises the steps of:
    creating a desired dynamic satellite signal model and a radio channel model with multipath components, resulting in a group of signals to be generated;
    calculating locations of the plurality of transmitting antennas in the test chamber, with which the signals to be generated are most optimally achieved by simulating positions that resemble real positions of real satellites; and
    placing the plurality of transmission antennas into the calculated locations before commencing an actual test.

7. The method according to claim 1, wherein the method further comprises the steps of:
    modelling at least one environment of real world, comprising at least one of an urban environment model, a suburban environment model, a country-side environment model, a park area environment model and an interior environment model; and
    selecting an environment model among the environment models for the test.

8. The method according to claim 7, wherein the method further comprises the step of: modelling a dynamic radio channel based on shadowing and/or reflecting effects of objects present in the selected environment model, and effect of the phantom object.

9. The method according to claim 8, wherein the effect of the phantom object is created by simulating effect of a user of the device under test programmably in a processor without placing a physical phantom object in the test chamber.

10. A system for dynamically simulating a Global Navigation Satellite System across a virtual sky, wherein the system comprises:
a test chamber comprising a plurality of transmitting antennas, distributed in a free formation across a virtual sky, comprising directions above and below a horizon with respect to the test chamber;
a device under test placed in the test chamber, wherein the test chamber comprises a phantom object placed in close distance or in contact with the device under test;
a moving and/or rotating and/or oscillating device configured to simulate movements of a real user wearing or holding or carrying the device under test by moving and/or rotating and/or oscillating a part or the whole of the phantom object during the measurement, wherein the phantom object resembles a real human shape comprising at least an upper half of a human body, comprising a body section and at least one arm section, wherein the phantom object has an effect in a measured radio channel, and wherein the arm section of the human phantom object is moved in relation to the body section similarly as in a walking or a running motion of a real human user;
a processor to create a dynamic satellite signal model, the model simulating movement of a plurality of satellites in the sky for a given receiver location and the model comprising all multipath components of satellite signals;
the plurality of transmitting antennas configured to be driven individually in order to create simulated Global Navigation Satellite System signals according to the dynamic satellite signal model, wherein a single satellite transmission signal is modelled through creating the simulated Global Navigation Satellite System signal with at least two transmitting antennas and interpolating these signals;
the processor configured to calculate a position from the received signals of the device under test; and
the processor configured to determine a position error by comparing the calculated position to a reference position.

11. The system according to claim 10, wherein the plurality of transmitting antennas are fixed to an inner wall of the test chamber, and the device under test is placed substantially in center of the test chamber.

12. The system according to claim 10, wherein the phantom object is a human phantom object comprising a head, a body and at least one arm section, or comprising a part of a human body.

13. The system according to claim 10, wherein a signal generator is configured to drive the plurality of transmitting antennas, the signal generator further comprising or being connected to a channel emulator.

14. The system according to claim 13, wherein cable lengths from the signal generator via the channel emulator into the transmitting antennas within the test chamber are optimized to have an equal length, or the processor is arranged to take the differences in the cable lengths into account in calculating the signals to be transmitted.

15. The system according to claim 10, wherein the system further comprises
the processor configured to create a desired dynamic satellite signal model and a radio channel model with multipath components, resulting in a group of signals to be generated;
the processor configured to calculate locations of the plurality of transmitting antennas in the test chamber, with which the signals to be generated are most optimally achieved by simulating positions that resemble real positions of real satellites; and the plurality of the transmitting antennas configured to be placed into the calculated locations before commencing an actual test.

16. The system according to claim 10, wherein the system further comprises:
channel emulator configured to model at least one environment of the real world, comprising at least one of an urban environment model, a suburban environment model, a country-side environment model, a park area environment model and an interior environment model; and
the processor configured to select an environment model among the environment models for the test.

17. The system according to claim 16, wherein the system further comprises: the channel emulator configured to model a dynamic radio channel based on shadowing and/or reflecting effects of objects present in the selected environment model, and effect of the phantom object.

18. The system according to claim 17, wherein the effect of the phantom object is created by simulating the effect of a user of the device under test programmably in the processor of the system without placing a physical phantom object in the test chamber.

* * * * *